(12) United States Patent
Knab et al.

(10) Patent No.: US 7,705,554 B2
(45) Date of Patent: Apr. 27, 2010

(54) CIRCUIT ARRANGEMENT AND METHOD FOR ADJUSTING THE POWER CONSUMPTION OF A LOAD THAT CAN BE OPERATED BY A DIRECT-VOLTAGE SYSTEM

(75) Inventors: Norbert Knab, Appenweier (DE); Nikolas Haberl, Sinzheim (DE); Michael Koerner, Buehl-Altschweier (DE)

(73) Assignee: Robert Bosch GmbH, Stuttgart (DE)

( * ) Notice: Subject to any disclaimer, the term of this patent is extended or adjusted under 35 U.S.C. 154(b) by 140 days.

(21) Appl. No.: 11/630,276

(22) PCT Filed: Jun. 1, 2005

(86) PCT No.: PCT/EP2005/052496

§ 371 (c)(1),
(2), (4) Date: Dec. 20, 2006

(87) PCT Pub. No.: WO2005/124991

PCT Pub. Date: Dec. 29, 2005

(65) Prior Publication Data

US 2007/0229011 A1 Oct. 4, 2007

(30) Foreign Application Priority Data

Jun. 22, 2004 (DE) .................. 10 2004 030 129

(51) Int. Cl.
*G05F 1/10* (2006.01)
(52) U.S. Cl. ............. 318/650; 318/400.22; 318/400.26; 318/635; 323/282; 340/693.3

(58) Field of Classification Search .......... 318/254, 318/434, 599, 400.01, 400.31, 432, 805, 318/400.26, 400.22, 722, 727, 822, 635, 318/650; 323/282; 340/693.3
See application file for complete search history.

(56) References Cited

U.S. PATENT DOCUMENTS

| 4,085,355 | A | * | 4/1978 | Fradella ...................... 318/703 |
| 4,975,820 | A | * | 12/1990 | Szepesi .................. 363/21.17 |
| 5,018,041 | A | * | 5/1991 | Szepesi ........................ 361/18 |
| 5,136,220 | A | * | 8/1992 | Philipp ....................... 318/362 |
| 5,184,272 | A | * | 2/1993 | Suda et al. .................... 361/87 |
| 5,285,143 | A | * | 2/1994 | Bahr et al. .................. 318/805 |
| 5,450,520 | A | * | 9/1995 | Carobolante ................ 388/815 |
| 5,508,872 | A | * | 4/1996 | Khoo et al. .................... 361/42 |

(Continued)

FOREIGN PATENT DOCUMENTS

DE 42 09 167 A1 9/1993

(Continued)

*Primary Examiner*—Bentsu Ro
*Assistant Examiner*—Antony M Paul
(74) *Attorney, Agent, or Firm*—Ronald E. Greigg

(57) ABSTRACT

A circuit arrangement and a method for adjusting the power consumption of a load of a cooling fan motor of a motor vehicle that can be operated by a direct-voltage system has at least one semiconductor switch in the supply current circuit of the load, and a control unit for triggering the semiconductor switch or switches. The load is connectable via at least one sense field-effect transistor to the direct-voltage system the measurement output of the sense FET is connected to the control unit, and the control unit furnishes a signal corresponding to the current consumption of the load at the respective operating point.

8 Claims, 1 Drawing Sheet

U.S. PATENT DOCUMENTS

| | | | |
|---|---|---|---|
| 5,714,809 A * | 2/1998 | Clemo | 307/125 |
| 5,723,958 A * | 3/1998 | Boll et al. | 318/432 |
| 5,901,051 A * | 5/1999 | Takahashi et al. | 363/21.18 |
| 5,973,367 A * | 10/1999 | Williams | 257/365 |
| 5,986,441 A * | 11/1999 | Koroncai et al. | 323/277 |
| 6,055,359 A * | 4/2000 | Gillett | 388/819 |
| 6,151,186 A * | 11/2000 | O'Farrell | 360/78.04 |
| 6,218,904 B1 * | 4/2001 | Panther | 330/296 |
| 6,347,028 B1 * | 2/2002 | Hausman et al. | 361/93.1 |
| 6,433,386 B1 * | 8/2002 | Yun et al. | 257/341 |
| 6,891,342 B2 * | 5/2005 | Nakamura et al. | 318/77 |
| 6,960,896 B1 * | 11/2005 | Shu et al. | 318/400.06 |
| 7,034,542 B2 * | 4/2006 | Peterson | 324/522 |
| 7,039,150 B1 * | 5/2006 | Drori | 375/377 |
| 7,102,337 B2 * | 9/2006 | Wheeler et al. | 323/282 |
| 7,122,984 B2 * | 10/2006 | Koch et al. | 318/400.31 |
| 2003/0015979 A1 * | 1/2003 | Karwath | 318/254 |
| 2004/0135529 A1 * | 7/2004 | Yoshitomi et al. | 318/254 |
| 2007/0001643 A1 * | 1/2007 | Buerk et al. | 318/811 |

FOREIGN PATENT DOCUMENTS

| | | |
|---|---|---|
| DE | 43 29 919 A1 | 3/1995 |
| WO | WO 2004/051832 A1 | 6/2004 |

\* cited by examiner

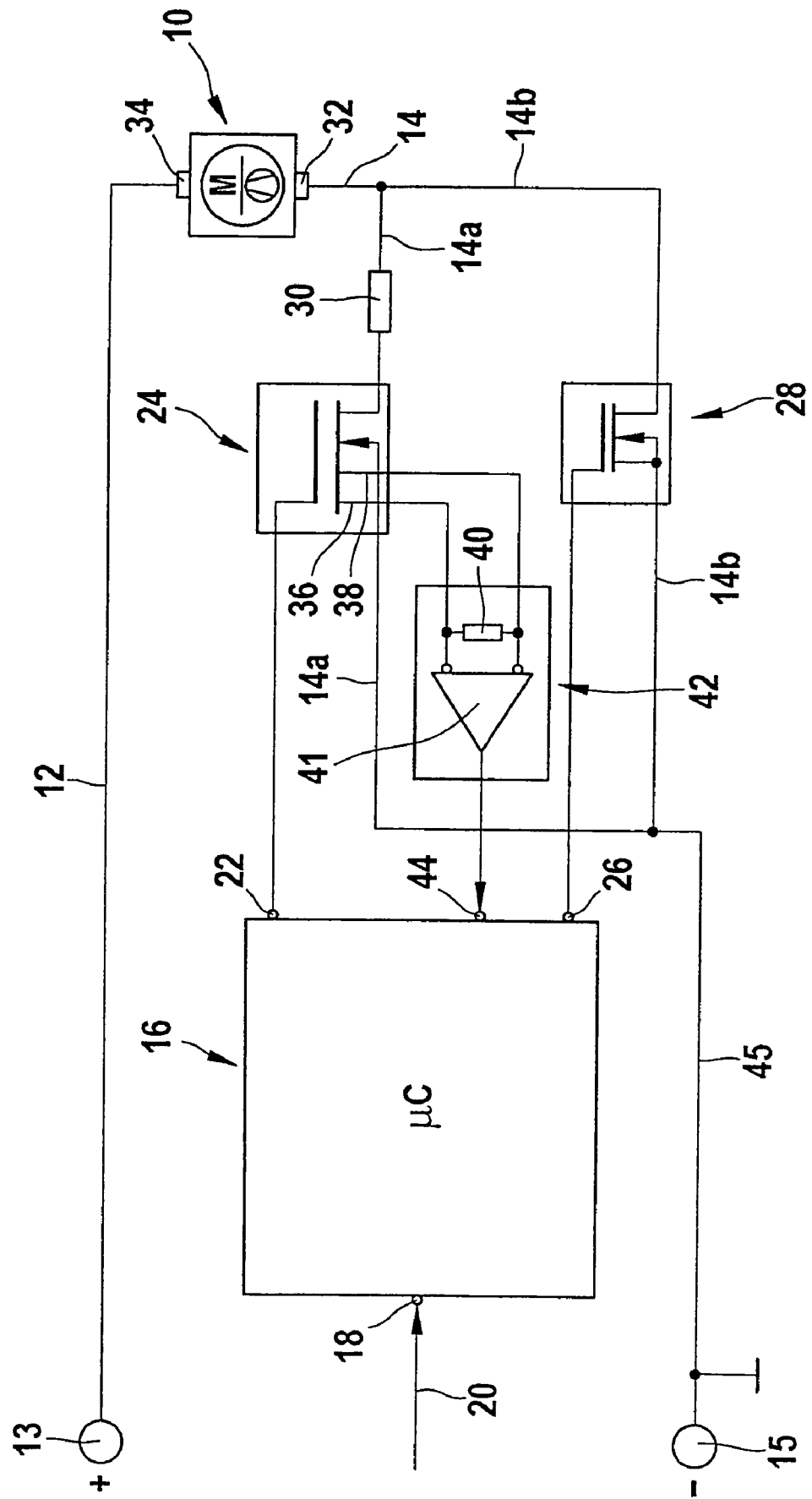

CIRCUIT ARRANGEMENT AND METHOD FOR ADJUSTING THE POWER CONSUMPTION OF A LOAD THAT CAN BE OPERATED BY A DIRECT-VOLTAGE SYSTEM

CROSS-REFERENCE TO RELATED APPLICATION

This application is a 35 USC 371 application of PCT/EP 2005/052496 filed on Jun. 1, 2005.

BACKGROUND OF THE INVENTION

1. Field of the Invention

The invention is based on a circuit arrangement and a method for adjusting the power consumption of a load, in particular of a cooling fan motor of a motor vehicle, that can be operated by a direct-voltage system.

2. Description of the Prior Art

German Patent Disclosure DE 100 44 388 A discloses a circuit arrangement for turning a high-powered direct-current motor on and off, which motor can be operated by the on-board electrical system of a motor vehicle. The circuit is connectable to the direct-current system via a semiconductor switch with an associated control unit. For thermal relief of the semiconductor switch after the actuation current has faded, the semiconductor switch is bridged by a relay contact. With the known arrangement, it is not possible to detect and monitor the motor current.

From German Patent DE 196 48 710 C, a circuit arrangement is also known which connects an electric motor of the cooling fan of an internal combustion engine directly to the current supply, on the one hand via a current path with a series resistor and on the other via a current path without a series resistor, for two-stage triggering of the electric motor at different rotary speeds. The switchover of the triggering is effected by means of a control unit, which connects the electric motor to the voltage source via one of the two lead lines. In addition, a microtemperature fuse is disposed in the current circuit with the series resistor and if the current rises impermissibly high, this fuse interrupts this current circuit via the series resistor. The control unit for the switchover of the current paths does not receive any feedback about the magnitude at the time of the supply current for the electric motor.

OBJECT AND SUMMARY OF THE INVENTION

The object of the invention is to provide an improved circuit arrangement and a method for adjusting the power consumption of a load, in particular of a direct-current motor, that can be operated by a direct-voltage system, in such a way that at least the supply current circuit or circuits of the load that are thermally critical with regard to the supplied power are monitored with the least possible effort and expense, and a thermal overload on the arrangement is avoided by means of a fast enough shutoff.

In accordance with this invention, by the use of a sense field-effect transistor (sense FET) as a switching element in at least one supply current circuit of the load, and by the evaluation of the detected current value by the triggering electronics of the circuit arrangement, an especially simple and advantageous way, both in terms of circuitry and in a structural sense, of monitoring the operating point of the load is created. The circuit arrangement of the invention and the associated method are especially advantageous wherever high loads, such as large direct-current motors, are connected to a direct-voltage system, and thermal overloads, for instance from blocking of a motor or overheating of a series resistor for such a motor, must be avoided.

In the use of the circuit arrangement of the invention and the associated method for operating a high-power direct-current motor by a direct-voltage system, an advantageous embodiment of the invention is obtained if, for adjusting various rotary speeds, the motor is selectively connected by the control unit to the direct-voltage system via at least one series resistor and at least one sense FET, or via a further semiconductor switch, preferably in the form of a "normal" field-effect transistor, and a current path without a series resistor. Turning on a high-power direct-current motor is always done via a current circuit having a series resistor and a sense FET for limiting and monitoring the power consumption of the motor. The switchover of the current supply for the motor to a different supply current circuit without a series resistor for adjusting a higher rotary speed is not done until after the actuation current fades and the lower rotary speed corresponding to the motor current reduced by the series resistor is reached, so that blockage of the motor, for instance, can be detected immediately without additional expense for circuitry, from the current consumption that can be measured with the sense FET.

BRIEF DESCRIPTION OF THE DRAWING

The invention will be more fully described herein below, with reference to the single drawing FIGURE which schematically shows a circuit arrangement for adjusting and monitoring the power consumption of a cooling fan motor that is operated by a direct-voltage system and has two rotary speed stages.

DESCRIPTION OF THE PREFERRED EMBODIMENTS

In the drawing, a permanent-magnetically excited direct-current motor with an integrated cooling fan is shown at 10. The motor is connected via a line 12 to the positive pole 13 of a direct-current source and via lines 14, 14a, 14b and 45 to the negative pole 15 of the source. A sense FET 24 and a resistor 30 are located in the course of the line 14a, and a FET 28 is located in the course of the line 14b. The direct-voltage system is formed here by the on-board electrical system of a motor vehicle, with a supply voltage of approximately 13 V. Depending on the size of the motor vehicle engine, the direct-current motor 10 that forms the load is designed for a rated current of approximately 10 to 50 A on being coupled to a radiator fan of a motor vehicle. The short-circuit current of such a motor in the case of blockage reaches approximately four times the value of the rated current.

For triggering the direct-current motor 10, a control unit 16 is used, for instance in the form of a microcontroller, which at its input 18 receives a control signal 20, which is formed from a plurality of relevant parameters for the cooling demand of the motor vehicle engine, in particular the coolant temperature, the speed of the motor vehicle engine, and by the cooling demand when the air conditioner is on.

In the exemplary embodiment shown, the motor control is designed in two stages; a first output 22 of the control unit 16 is connected to the gate electrode of a sense FET 24, and a second output 26 of the control unit 16 is connected to the gate electrode of a "normal" field-effect transistor, in particular a MOSFET. Via a series resistor 30 of approximately 0.1 to 1Ω and the lines 14a, 14, the drain electrode of the sense FET 24 is connected to the motor contacting means 32 oriented toward the negative pole 15 of the direct-voltage system; via the lines 14a and 45, the source electrode of the sense FET 24 is connected to the negative pole 15 of the direct-voltage system, and this pole is connected to ground. The measurement outputs of the sense FET 24 are marked 36 and 38. Via these outputs, a defined partial current of the load current carried by the sense FET 24 flows and, at a resistor 40 of an evaluation circuit 42 for the sense signal, generates a voltage drop which in turn is delivered via an operational amplifier 41 to an input 44 of the control unit 16. The motor contacting means 32 associated with the negative pole 15 of the direct-voltage system is also connected directly to the negative pole 15 of the direct-voltage system and to ground via the lines 14a, 14b, the drain-to-source path of the MOSFET 28, and the line 45.

The circuit arrangement functions as follows:

As a function of the heat incidence in the cooling system of the motor vehicle engine, not shown, the direct-current motor 10 is turned on as needed, as soon as an actuation signal 20 is applied to the input 18 of the control unit 16. The control unit 16 then generates a signal for making the sense FET 24 conducting, which signal is applied via the output 22 of the control unit to the gate electrode of the sense FET 24 for the duration of motor operation at the lower rotary speed. In other words, the direct-current motor 10 is not clocked but instead is actuated in the continuous mode, independently of the cooling demand, in each case first via the series resistor 30. The direct-current motor 10 operates in a predetermined load range; at its input 44, via the load current-dependent signal of the evaluation circuit 42, the control unit 16 detects a regular operating point of the direct-current motor 10, and the direct-current motor remains on as long as the control signal 20 is present at the input 18 of the control unit 16. Conversely, if the power consumption of the direct-current motor 10 is too high, for instance because of a mechanical blockage of the motor or of the fan or because of other irregular external conditions, then the measurement current picked up at the measurement outputs 36 and 38 of the sense FET 24 increases to above a predeterminable threshold, and the control unit 16 detects the signal at its input 44 as an error. In the control unit 16, this error report is then assessed via the sense FET 24 either as a blockage of the motor, if the current is high enough, or for instance as an overload and accordingly as a possible instance of overheating of the series resistor 30. If such an overload is detected, the direct-current motor 10 is disconnected from the direct-voltage system 13, 15. If the cooling demand is relatively high, the control unit 16 switches over to an operating mode of the direct-current motor 10 without a series resistor, and accordingly with an increased motor rpm with direct connection of the direct-current motor 10 to the negative pole 15 of the direct-voltage system via the MOSFET 28.

The circuit arrangement and the method used for adjusting the power consumption of the connected load can be designed in various ways. One often-used arrangement is shown in the exemplary embodiment for a direct-current motor with two different rotary speeds. One or more rotary speed stages can be added by turning the direct-current motor 10 on via series resistors of different resistance; either a sense FET, with the possibility of current monitoring, or a "normal" field-effect transistor can be employed as switching elements. It is understood that even the highest rotary speed stage, when the direct-current motor 10 is connected without a series resistor, can be effected with current monitoring by a sense FET.

With the circuit of the invention, conventional multi-stage circuits for connection of inductive loads in particular to a direct-voltage system can be improved such that mechanical parts of relays are omitted entirely, and semiconductor switches can be employed in an especially low-loss way while simultaneously creating a capability of monitoring the operating point of the connected load. In an unclocked mode of operation of the load connected, the power loss in the semiconductor switches is slight, and only slight cooling of the switch elements is required. In this kind of usage, the noise production that occurs in clocking is eliminated, and the electromagnetic compatibility is improved. If a malfunction, such as blockage of a direct-current motor, is detected only in the lowest rotary speed stage of the direct-current motor, then via the sense FET 24 that is actuated in this rotary speed stage, only a relatively slight current flows, and as a result the sense FET can have a higher resistance of its drain-to-source path (RDSon) and thus entails lesser costs. Detecting blockage is done here via a current measurement in an especially simple and advantageous way; the high current of a blocked direct-current motor is detectable since it is substantially above the operating current of the motor. The evaluation of the sense signal in the evaluation circuit 42 can be done very simply in the unclocked mode, since this involves a direct-voltage signal.

The foregoing relates to a preferred exemplary embodiment of the invention, it being understood that other variants and embodiments thereof are possible within the spirit and scope of the invention, the latter being defined by the appended claims.

The invention claimed is:

1. A circuit arrangement for adjusting the power consumption of a load of a motor that can be operated by a direct-voltage system, the circuit comprising at least one semiconductor switch in the supply current circuit of the load, a control unit for triggering the semiconductor switch or switches, at least one sense FET operable to connect the load to the direct-voltage system, and means connecting the measurement output of the sense FET to the control unit, the control unit being operable to furnish a signal corresponding to the current consumption of the load at the respective operating point, wherein the load is connectable to the direct-voltage system selectively via at least one resistor and at least one sense FET both of which are connected in series with the load and together carry one level of current to the load, or via a further semiconductor switch and a current path without a series resistor, which further semiconductor switch and current path carries a second level of current to the load.

2. The circuit arrangement as defined by claim 1, wherein the load is connectable to the direct-voltage system via at least one series resistor.

3. A method for adjusting the power consumption of a load that can be operated by a direct-voltage system having at least one semiconductor switch in the supply current circuit of the load and having a control unit for triggering the semiconductor switch or switches, the method comprising employing at least one sense field-effect transistor (sense FET) for connecting the load to the direct-voltage system, measuring the current consumption of the load at the respective operating point via the measurement terminals of the sense FET, and generating a signal for the control unit from that measurement, wherein the current supply circuit is a multi-stage circuit for the load, and wherein actuation of the load is effected via a current circuit having a series resistor and a sense FET as semiconductor switches wherein as long as a predeterminable threshold of the supply current is not exceeded, the control unit, on the basis of the measurement values furnished by the sense FET, switches over from a supply current circuit with a series resistor to a supply current circuit without a series resistor if the actuation current of the motor fades and a lower rotary speed corresponding to the motor current reduced by the series resistor is reached and if the cooling demand is relatively high, and wherein if the pre-determined threshold of the supply current is exceeded, the motor is disconnected from the direct-voltage system.

4. The method as defined by claim 3, wherein the load is a permanent-magnetically excited direct-current motor connected, unclocked, to the direct-voltage system via separately triggerable semiconductor switches.

5. The method as defined by claim 4, further comprising monitoring the occurrence of a blockage of the connected direct-current motor by means of the control unit because of the measurement values furnished by the sense FET, and the current supply of the motor is interrupted as needed.

6. A method for adjusting the power consumption of a load, that can be operated by a direct-voltage system having at least one semiconductor switch in the supply current circuit of the load and having a control unit for triggering the semiconductor switch or switches, the method comprising employing at least one sense field-effect transistor (sense FET) for connecting the load to the direct-voltage system, measuring the current consumption of the load at the respective operating point via the measurement terminals of the sense FET, and generating a signal for the control unit from that measurement, wherein the load is a permanent-magnetically excited direct-current motor connected, unclocked, to the direct-voltage system via separately triggerable semiconductor switches, wherein as long as a predeterminable threshold of the supply current is not exceeded, the control unit, on the basis of the measurement values furnished by the sense FET, switches over from a supply current circuit with a series resistor to a supply current circuit without a series resistor if the actuation current of the motor fades and a lower rotary speed corresponding to the motor current reduced by the series resistor is reached and if the cooling demand is relatively high, and wherein if the pre-determined threshold of the supply current is exceeded, the motor is disconnected from the direct-voltage system.

7. The method as defined by claim 6, further comprising monitoring the occurrence of a blockage of the connected direct-current motor by means of the control unit because of the measurement values furnished by the sense FET, and the current supply of the motor is interrupted as needed.

8. A method for adjusting the power consumption of a load that can be operated by a direct-voltage system having at least one semiconductor switch in the supply current circuit of the load and having a control unit for triggering the semiconductor switch or switches, the method comprising employing at least one sense field-effect transistor (sense FET) for connecting the load to the direct-voltage system, measuring the current consumption of the load at the respective operating point via the measurement terminals of the sense FET, and generating a signal for the control unit from that measurement, wherein as long as a predeterminable threshold of the supply current is not exceeded, the control unit, on the basis of the measurement values furnished by the sense FET, switches over from a supply current circuit with a series resistor to a supply current circuit without a series resistor if the actuation current of the motor fades and a lower rotary speed corresponding to the motor current reduced by the series resistor is reached and if the cooling demand is relatively high, and wherein if the pre-determined threshold of the supply current is exceeded, the motor is disconnected from the direct-voltage system.

* * * * *